(12) United States Patent
Gong et al.

(10) Patent No.: US 10,748,944 B2
(45) Date of Patent: Aug. 18, 2020

(54) ARRAY SUBSTRATE COMPRISING TRANSISTOR AND CAPACITOR, MANUFACTURING METHOD THEREFOR, DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Kui Gong, Beijing (CN); Xianxue Duan, Beijing (CN); Cheng Chen, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/327,153

(22) PCT Filed: May 9, 2018

(86) PCT No.: PCT/CN2018/086129
§ 371 (c)(1),
(2) Date: Feb. 21, 2019

(87) PCT Pub. No.: WO2018/205947
PCT Pub. Date: Nov. 15, 2018

(65) Prior Publication Data
US 2019/0189650 A1 Jun. 20, 2019

(30) Foreign Application Priority Data
May 10, 2017 (CN) .......................... 2017 1 0326432

(51) Int. Cl.
*H01L 27/12* (2006.01)
*H01L 21/265* (2006.01)
*H01L 21/324* (2006.01)

(52) U.S. Cl.
CPC ...... *H01L 27/1288* (2013.01); *H01L 27/1222* (2013.01); *H01L 27/1255* (2013.01);
(Continued)

(58) Field of Classification Search
CPC ............. H01L 27/1288; H01L 27/1222; H01L 27/1255; H01L 27/1274; H01L 21/26506; H01L 21/324
See application file for complete search history.

(56) References Cited

U.S. PATENT DOCUMENTS 6,043,511 A * 3/2000 Kim .................... H01L 27/1288
257/59
6,369,410 B1 * 4/2002 Yamazaki ............. H01L 29/458
257/412

(Continued)

FOREIGN PATENT DOCUMENTS

CN 1963614 A 5/2007
CN 1963914 A 5/2007

(Continued)

OTHER PUBLICATIONS

International Search Report and Written Opinion dated Aug. 1, 2018; PCT/CN2018/086129.

*Primary Examiner* — Peter Bradford

(57) ABSTRACT

A method for manufacturing an array substrate, including: forming a semiconductor material film on a substrate, the method further including: forming a metal film covering the semiconductor material film; and performing a single patterning process on the metal film and the semiconductor material film to form an active layer, a semiconductor material remained pattern and a first electrode of a storage capacitor. The semiconductor material remained pattern is in a same layer as the active layer; and the first electrode of the storage capacitor is formed of the metal film and is on a side, (Continued)

away from the substrate, of the semiconductor material remained pattern. An array substrate and a display device are also provided.

20 Claims, 7 Drawing Sheets

(52) U.S. Cl.
CPC .... *H01L 27/1274* (2013.01); *H01L 21/26506* (2013.01); *H01L 21/324* (2013.01)

(56) References Cited

U.S. PATENT DOCUMENTS

| | | | |
|---|---|---|---|
| 6,380,559 B1* | 4/2002 | Park | G02F 1/13458 |
| | | | 257/59 |
| 2001/0009283 A1 | 7/2001 | Arao et al. | |
| 2004/0263706 A1* | 12/2004 | Cho | G02F 1/136286 |
| | | | 349/43 |
| 2006/0038932 A1* | 2/2006 | Murade | G02F 1/136227 |
| | | | 349/42 |
| 2007/0102707 A1 | 5/2007 | Lee et al. | |
| 2008/0135909 A1 | 6/2008 | Takeguchi et al. | |
| 2018/0358421 A1 | 12/2018 | Gai et al. | |
| 2019/0189650 A1 | 6/2019 | Gong et al. | |

FOREIGN PATENT DOCUMENTS

| | | |
|---|---|---|
| CN | 101196668 A | 6/2008 |
| CN | 105914229 A | 8/2016 |
| CN | 107170753 A | 9/2017 |

\* cited by examiner

Forming a semiconductor material film on a substrate, and forming a metal film covering the semiconductor material film

Performing a single patterning process on the metal film and the semiconductor material film to form an active layer, a semiconductor material remained pattern disposed in the same layer as the active layer, and a first electrode of a storage capacitor which is disposed on a side of the semiconductor material remained pattern away from the substrate and is formed of the metal film

FIG. 1

ARRAY SUBSTRATE COMPRISING TRANSISTOR AND CAPACITOR, MANUFACTURING METHOD THEREFOR, DISPLAY DEVICE

TECHNICAL FIELD

Embodiments of the present disclosure relate to an array substrate, a manufacturing method thereof, and a display device.

BACKGROUND

An array substrate usually comprises a thin film transistor (TFT) and a storage capacitor. In the related art, in order to simplify the preparation process and reduce the number of patterning processes using a mask, a semiconductor pattern is usually formed in a region where a storage capacitor is required through the same patterning process while forming an active layer of a semiconductor material. And then, ion doping is performed on the semiconductor pattern so as to convert it from a semiconductor to a conductive material having a conductive property, thereby serving as one of the electrodes of the storage capacitor.

However, the electrode has a poor conductivity as it is formed of a semiconductor through ion doping, rather than being formed of metal material, and the performance of the storage capacitor is adversely affected.

SUMMARY

At least one embodiment of the present disclosure provides a method for manufacturing an array substrate, comprising: forming a semiconductor material film on a substrate, the method further comprising: forming a metal film covering the semiconductor material film; and performing a single patterning process on the metal film and the semiconductor material film to form an active layer and a first electrode of a storage capacitor. The semiconductor material remained pattern is in a same layer as the active layer, and the first electrode of the storage capacitor is formed of the metal film and is on a side, which is away from the substrate, of a semiconductor material remained pattern.

In one embodiment of the present disclosure, the semiconductor material film is a polysilicon film, performing the single patterning process on the metal film and the semiconductor material film to forming the active layer and the first electrode of the storage capacitor comprising: performing the single patterning process and an ion doping process on the metal film and the polysilicon film by using a gray tone mask, so as to form the active layer and the first electrode of the storage capacitor, wherein the active layer comprises a source contact region and a drain contact region which are formed by the ion doping process and are disposed opposite to each other.

In one embodiment of the present disclosure, performing the patterning process and the ion doping process on the metal film and the polysilicon film by using the gray tone mask, so as to form the active layer and the first electrode of the storage capacitor, wherein the active layer comprises the source contact region and the drain contact region which are formed by the ion doping process and are disposed opposite to each other comprises: forming a photoresist layer covering the metal film; exposing and developing the photoresist layer through the gray tone mask so as to form a first photoresist retained region, a second photoresist retained region, and a photoresist completely removed region, wherein the first photoresist retained region corresponds to a region for the first electrode of the storage capacitor to be formed and is slightly larger than the region for the first electrode of the storage capacitor to be formed; the second photoresist retained region comprise a first region and second regions which are located at both sides of the first region and are contiguous to the first region, the second region corresponding to the source contact region and the drain contact region in the active layer which are disposed opposite to each other, the first region corresponding to remaining regions of the active layer to be formed, and thicknesses of the first photoresist retained pattern, the first region and the second region are reduced in order; the photoresist completely removed region corresponding to regions of the metal film other than regions for the first electrode, the source/drain electrodes and the active layer; a region of the metal thin film exposed by the photoresist completely removed region is over-etched by wet etching so as to form the first electrode of the storage capacitor under the first photoresist retained pattern and a metal shielding pattern under the second photoresist retained pattern, wherein an outline of the metal shielding pattern is located within an outline of the second photoresist retained pattern; etching a portion of the polysilicon film exposed by the first photoresist retained pattern and the second photoresist retained pattern, so as to form a polysilicon retained pattern under the first electrode of the storage and the active layer under the metal shielding pattern, wherein a pattern of the active layer is substantially same as the second photoresist retained pattern; ion-doping a region of the active layer exposed by the metal shielding pattern through an ion implantation process, so as to form the source contact region and the drain contact region which are formed by ion implantation treatment and are disposed opposite to each other, removing the second photoresist retained pattern and the metal shielding pattern in sequence, so as to expose the active layer, and removing the first photoresist retained pattern so as to expose the first electrode of the storage capacitor.

In one embodiment of the present disclosure, removing the second photoresist retained pattern and the metal shielding pattern in sequence, so as to expose the active layer comprises: ashing the first photoresist retained pattern and the second photoresist retained pattern through an ashing process so as to remove the second photoresist retained pattern and to retain a portion of the first photoresist retained pattern in a direction of thickness; and etching a portion of the metal shielding pattern exposed by the second photoresist retained pattern which has been removed so as to remove the metal shielding pattern and expose the active layer.

In one embodiment of the present disclosure, when etching time for forming a pattern of the metal film which is same as the second photoresist retained pattern through wet-etching is t0, a time for the over-etching is (150%~200%)t0.

In one embodiment of the present disclosure, implanted ions can be P-type or N-type dopants.

In one embodiment of the present disclosure, the semiconductor material film is a polysilicon film; forming the semiconductor material film on the substrate comprises: forming a buffer layer and an amorphous silicon film on the substrate in sequence; and annealing the amorphous silicon film, so as to crystallize the amorphous silicon film into a polysilicon film.

In one embodiment of the present disclosure, the method further comprises, in sequence: forming a gate insulating layer covering the active layer and the first electrode of the storage capacitor; forming a gate metal pattern layer disposed on the gate insulating layer, the gate metal pattern layer comprising a gate electrode corresponding to the active layer, a gate line connected to the gate electrode, and a second electrode of the storage capacitor corresponding to the first electrode of the storage capacitor; forming an interlay insulating layer covering the gate metal pattern layer; forming a first through hole and a second through hole passing through the interlayer insulating layer and the gate insulating layer; and forming a source/drain metal pattern layer disposed on the interlayer insulating layer, the source/drain metal pattern layer comprising a source electrode connected to the source contact region through the first through hole, a drain electrode connected to the drain contact region through the second through hole, and a data line connected to the source electrode.

At least one embodiment of the present disclosure provides an array substrate, comprising an active layer made of a semiconductor material, a semiconductor retained pattern and a first electrode of a storage capacitor disposed on a substrate. The semiconductor material retained pattern is formed of the semiconductor material and is in a same layer as the active layer, and the first electrode of the storage capacitor is made of a metal material and is covered on the semiconductor material retained pattern.

In one embodiment of the present disclosure, a projection of the first electrode of the storage capacitor on the substrate is located within a projection of the semiconductor material retained pattern on the substrate.

In one embodiment of the present disclosure, the array substrate further comprises source/drain doping regions disposed in a same layer as the active layer, a width of the semiconductor material retained pattern protruding from the first electrode of the storage capacitor is substantially same as a width of the source/drain doping regions.

In one embodiment of the present disclosure, the array substrate further comprises a gate insulating layer covering the active layer and the first electrode of the storage capacitor, a gate electrode disposed on the gate insulating layer, and a second electrode of the storage capacitor disposed in a same layer as the gate electrode.

In one embodiment of the present disclosure, the gate electrode and the second electrode of the storage capacitor are formed through a single patterning process.

In one embodiment of the present disclosure, material for the gate electrode and the second electrode of the storage capacitor comprises at least one of Ag, Al, Ti, Au, Cu, Mo, and Cr.

At least one embodiment of the present disclosure provides a display device comprising the array substrate as described above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

FIG. 1 is a flow chart illustrating a method for manufacturing an array substrate according to an embodiment of the present disclosure;

REFERENCE SIGNS

Figure 2:
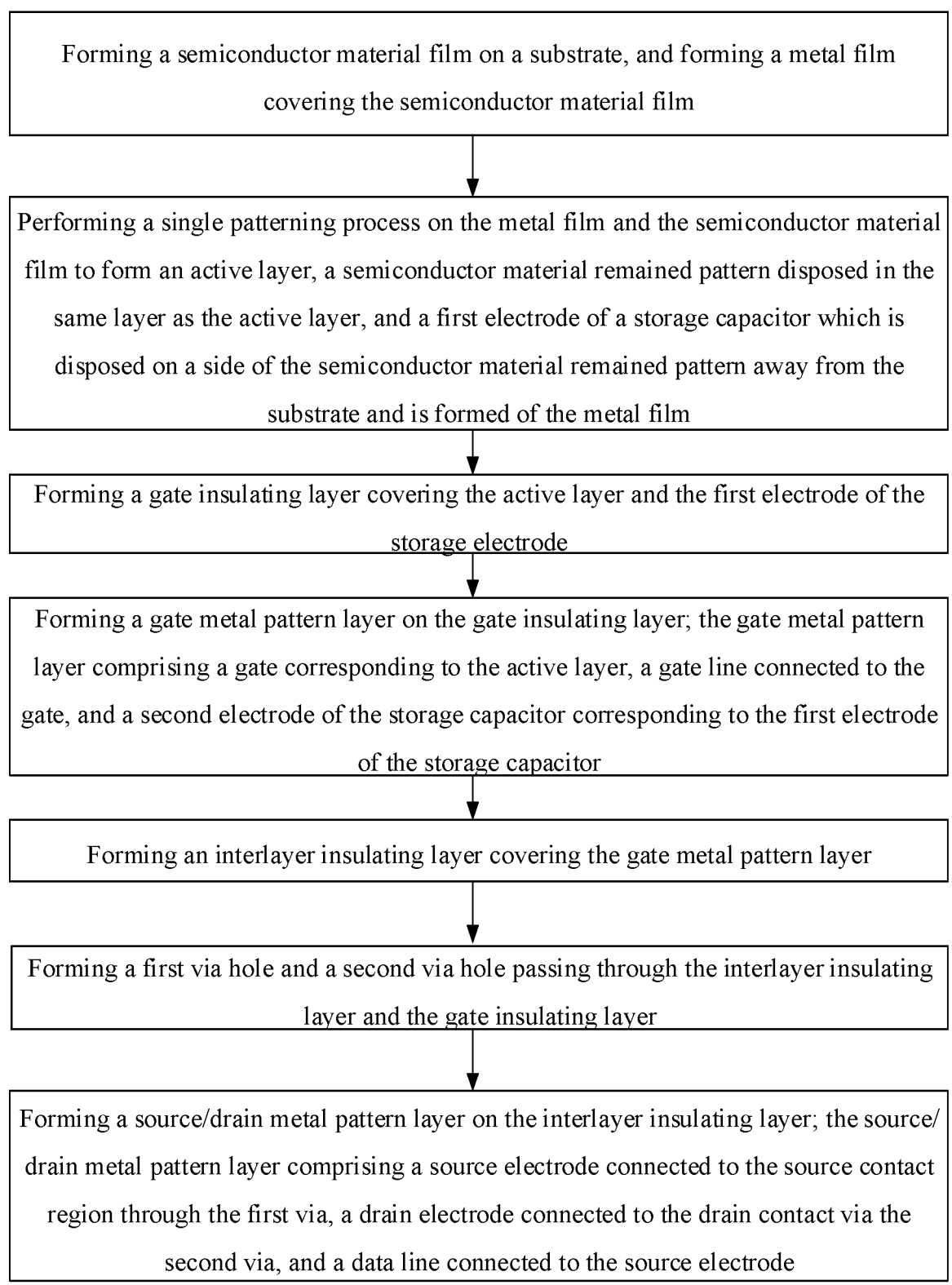
FIG. 2 is a flow chart illustrating a method for manufacturing an array substrate according to another embodiment of the present disclosure.

1—substrate;
2—buffer,

30—amorphous silicon film;
3—polysilicon film;
311—active layer,
3111—source contact region;
3112—drain contact region;
312—polysilicon retained pattern;
4—metal film;
411—metal shielding pattern;
412—first electrode of storage electrode;
5—photoresist layer;
510—photoresist completely removed region;
511—second photoresist retained pattern;
51a—first region;
511b—second region;
512—first photoresist retained pattern;
6—gate insulating layer,
7—gate electrode;
71—second electrode of storage electrode;
8—interlayer insulating layer;
9—through hole;
10—source electrode;
11—drain electrode.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

It should be noted that all terms (comprising technical terms and scientific terms) used in the embodiments of the present disclosure have the same meaning as commonly understood by one of ordinary skill in the art to which the present disclosure belongs, unless otherwise defined. It should also be understood that terms such as those defined in the ordinary dictionary should be interpreted as having meanings consistent with their meaning in the context of the related art, and should not be interpreted in terms of idealization or extreme formality unless explicitly stated herein.

For example, the terms "first", "second" and similar words used in the present disclosure do not denote any order, quantity, or importance, but are merely intended to distinguish different components. Words like "including" or "comprising" and etc. mean that an element or an article before them contains an element/elements or an article/articles listed thereafter and their equivalence, while not excluding other elements or articles. The terms "one side", "other side", "upper", "lower", "left", "right", etc. are only used to indicate relative positional relationships, and when absolute position of the object to be described is changed, the relative positional relationships are also changes accordingly. The terminology indicating orientation relationship or positional relationship is based on the orientation or positional relationship illustrated in the drawings, and is merely for the convenience of briefly describing the technical solutions of the present disclosure, and does not indicate or imply that the device or component referred to has a specific orientation, construction and operation in a particular orientation, and cannot be construed as a limit to the present disclosure.

Moreover, the size and the shape of each pattern, and the thickness of each film in the following figures in the present disclosure do not reflect the actual proportions of the corresponding structures in the array substrate, and are merely for illustrating concepts of the present disclosure.

As illustrated in FIG. 1, at least one embodiment of the present disclosure provides a method for manufacturing an array substrate, comprising:

forming a semiconductor material film on a substrate, and forming a metal film covering the semiconductor material film; and performing a single patterning process on the metal film and the semiconductor material film to form an active layer, a semiconductor material remained pattern disposed in the same layer as the active layer, and a first electrode of a storage capacitor which is disposed on a side of the semiconductor material remained pattern away from the substrate and is formed of the metal film.

It should be noted that, in the manufacturing method according to the embodiment of the present disclosure mentioned above, the "single patterning process" refers to processes comprising coating photoresist once, applying one mask, exposing and developing the photoresist, and etching a film layer or film layers, removing the photoresist, and specific patterns can be formed by treating the film layers through the processes.

And further, the term "formed in the same layer" involves at least two patterns, and refers to a structure in which at least two patterns are formed in a same film, for example, at least two patterns are formed from a film formed by the same material through a single patterning process. For example, in the present embodiment of the disclosure, what are formed in the same layer are the active layer and the semiconductor material remained pattern formed on the substrate.

Based on this, in the above manufacturing method according to an embodiment of the present disclosure, after forming the semiconductor material film, a metal film is subsequently formed or deposited, and then a single patterning process performed to form a lower metal electrode of the storage capacitor from the metal film when forming an active layer pattern of semiconductor material, thereby directly forming a first electrode of the storage capacitor of a metal material without increasing the number of the patterning processes.

Further, the semiconductor material for forming the active layer is a polysilicon material having a high carrier mobility, so as to further improve the switching performance of the thin film transistor in the array substrate.

Forming the semiconductor material film on the substrate comprises:

forming a buffer layer and an amorphous silicon film sequentially on the substrate;

annealing the amorphous silicon film, so as to crystallize the amorphous silicon film into a polysilicon film.

The buffer layer can be made of one of silicon oxide, silicon nitride, or a lamination of silicon oxide and silicon nitride, and is configured to block impurity ions contained in the glass substrate from diffusing into the active layer which will be formed later, thereby affecting the threshold voltage of the TFT device.

In annealing the amorphous silicon film, for example, annealing processes such as solid phase crystallization, laser crystallization (for example, excimer laser anneal crystallization, ELA) and the like can be adopted to crystallize the amorphous silicon film into polycrystalline silicon.

Thereafter, a metal film is subsequently deposited on the polysilicon film.

In related arts, it is generally required to perform ion implantation treatment on both side regions of an active layer formed of polysilicon material to form a conductor region on both sides thereof, and to improve contact performance with the source electrode and the drain electrode to be formed subsequently. However, in the related art, in order to reduce the number of the patterning process, it is usual to form a metal gate on the active layer, and then use the gate as a metal mask to perform ion doping on the two sides of the active layer not overlapping the gate so as to form a doped region. In this way, since a gate insulating layer is formed between the active layer and the gate electrode, it is inevitable for the doping ions to be remained in the gate insulating layer during the ion implantation, which causes damage to the gate insulating layer and results in decrease in a dielectric constant ε of the gate insulating layer. As the gate insulating layer is a part of the insulating layer between the two electrodes of the storage capacitor, the formula of the storage capacitor shows that the dielectric constant ε decreases due to damage of the gate insulating layer, thereby causing the capacitance value of the storage capacitor decrease and affecting display quality.

In the method for manufacturing the array substrate according to the embodiments of the present disclosure, performing the single patterning process on the metal film and the semiconductor material film to form an active layer, the semiconductor material remained pattern disposed in the same layer as the active layer, and the first electrode of the storage capacitor which is disposed on the side of the semiconductor material remained pattern away from the substrate and is formed of the metal film comprises: performing the single pattering process and the ion doping on the metal film and the polysilicon film by using a gray tone mask or a halftone mask, so as to from the active layer, the polysilicon retained pattern disposed on the same layer as the active layer, and the first electrode of the capacitor formed on the polysilicon film and formed of the metal film, wherein the active layer comprises a source contact region and a drain contact region which are formed by ion doping and are disposed opposite to each other.

That is, the source contact region and the drain contact region of the active layer which are in contact with the source electrode and the drain electrode, respectively, are conductive regions with conductor properties, so as to improve the contact performance of the source/drain electrodes with the active layer.

In this way, in the embodiment of the present disclosure, as the active layer is subjected to ion doping treatment before forming the gate insulating layer and the gate electrode, the ion doping process will not damage the gate insulating layer formed on the polysilicon film, and the dielectric constant of the gate insulating layer will not be changed, thereby ensuring the performance of the thin film transistor and the storage capacitor. And further, as the above-described masking process for ion doping on the active layer of the polysilicon film utilizes corresponding pattern in the patterning process performed on the metal film, the number of patterning processes through mask will not be increased.

Thereafter, as illustrated in FIG. 2, the manufacturing method further comprise:

forming a gate insulating layer covering the active layer and the first electrode of the storage electrode;

forming a gate metal pattern layer on the gale insulating layer; the gate metal pattern layer comprising a gate corresponding to the active layer, a gate line connected to the gate, and a second electrode of the storage capacitor corresponding to the first electrode of the storage capacitor:

forming an interlayer insulating layer covering the gate metal pattern layer;

forming a first via hole and a second via hole passing through the interlayer insulating layer and the gate insulating layer;

forming a source/drain metal pattern layer on the interlayer insulating layer, the source/drain metal pattern layer comprising a source electrode connected to the source contact region through the first via, a drain electrode connected to the drain contact via the second via, and a data line connected to the source electrode.

The above processing can be carried out through common means, and will not be elaborated herein.

Hereinafter, a manufacturing method for an array substrate according to an embodiment of the present disclosure will be described with reference to FIGS. 3 to 8, wherein the semiconductor material film is a polysilicon film.

Figure 3:
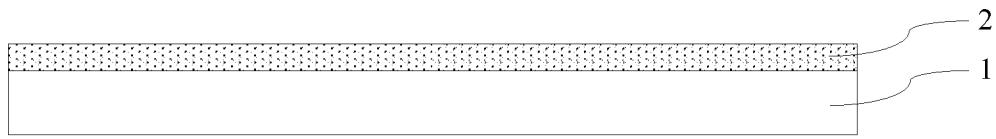
FIG. 3 is a schematic view illustrating a structure formed after a first step of a method for fabricating an array substrate according to an embodiment of the present disclosure.

As illustrated in FIG. 3, a base substrate 1 is prepared, and a buffer layer 2 is deposited on the base substrate; the buffer layer 2 is made of one of silicon oxide and silicon nitride, or a combination thereof.

Figure 4:
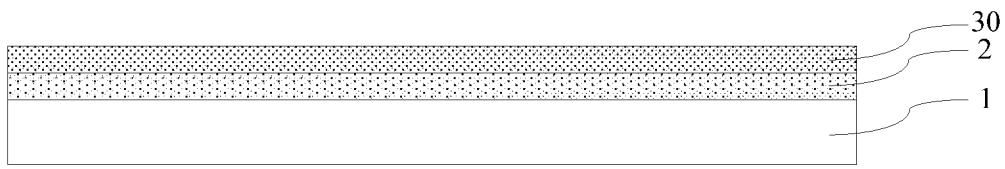
FIG. 4 is a schematic view illustrating a structure formed after a second step of a method for fabricating an array substrate according to an embodiment of the present disclosure.

As illustrated in FIG. 4, an amorphous silicon film 30 is deposited on the buffer layer 2 by a preparation method such as Plasma Enhanced Chemical Vapor Deposition (PECVD).

Figure 5:
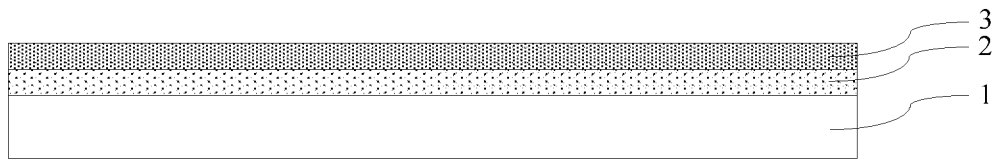
FIG. 5 is a schematic view illustrating a structure formed after a third step of a method for fabricating an array substrate according to an embodiment of the present disclosure.

As illustrated in FIG. 5, the amorphous silicon layer 30 is crystallized to form a polysilicon film 3 through, for example, an excimer laser annealing (ELA) process. After the excimer laser annealing process, the amorphous silicon layer undergoes structural recombination under the action of laser energy, that is, the whole the amorphous silicon layer is molten and then rapidly crystallized to form a polysilicon film.

For example, a chlorinated milling (XeCl) laser with a wavelength of 308 nm can be adopted in the excimer laser annealing process, and the laser overlap ratio is between 90% and 98% to ensure the concentration of the laser energy.

Figure 6:
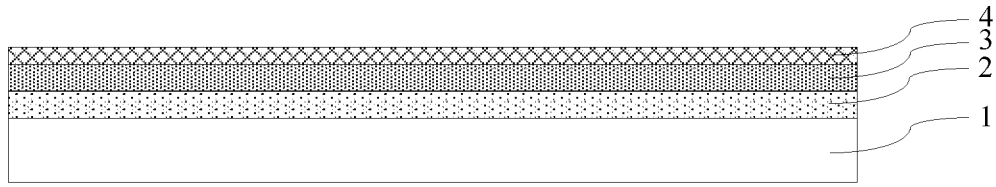
FIG. 6 is a schematic view illustrating a structure formed after a fourth step of a method for fabricating an array substrate according to an embodiment of the present disclosure.

As illustrated in FIG. 6, a metal film 4 is deposited on the polysilicon film 3 by, for example, magnetron sputtering, evaporation, or atomic deposition; wherein material for the metal film can comprise, but is not limited to, at least one of Ag, Al, Ti, Au, Cu, Mo, and Cr.

Figure 7:
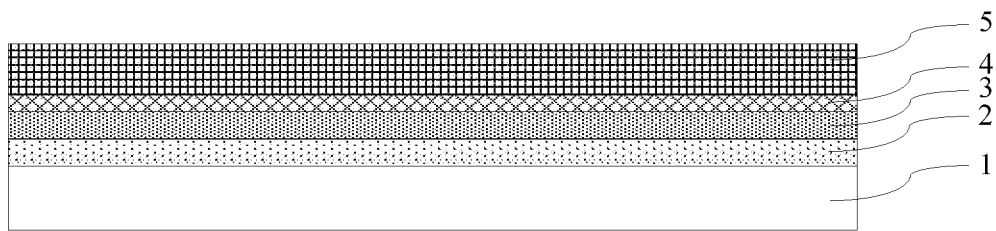
FIG. 7 is a schematic view illustrating a structure formed after a fifth step of a method for fabricating an array substrate according to an embodiment of the present disclosure.

As illustrated in FIG. 7, a photoresist (PR) layer 5 covering the metal film 4 can be formed by, for example, coating.

Figure 8:
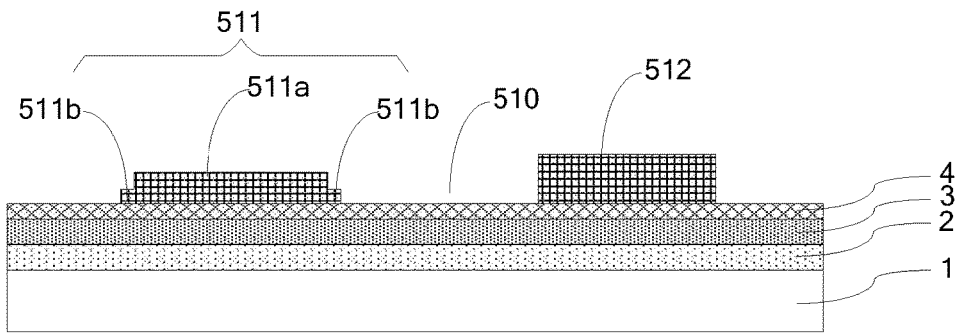
FIG. 8 is a schematic view illustrating a structure formed after a sixth step of a method for fabricating an array substrate according to an embodiment of the present disclosure.

As illustrated in FIG. 8, the photoresist layer 5 is exposed and developed by a gray tone or halftone mask to form a first photoresist retained pattern 512, a second photoresist retained pattern 511, and a photoresist completely removed region 510;

wherein the first photoresist retained pattern 512 corresponds to a region of the first electrode of the storage capacitor to be formed and is slightly larger than the region of the first electrode of the storage capacitor to be formed; the second photoresist retained pattern 511 is formed by the first region 511*a* and a second region 511*b* located on both sides of the first region 511*a* and contiguous to the first region 511*a*, the second region 511*b* corresponding to a source contact region and a drain contact region disposed opposite to each other in the active layer to be formed, the first region 511*a* corresponds to the remaining region in the active layer to be formed, and the thicknesses of the first photoresist retained pattern 512, the first region 511*a*, and the second region 511*b* are sequentially decreased; the photoresist completely removed region 510 corresponds to a region of the photoresist layer other than the first photoresist retained pattern and the second photoresist retained pattern.

A type of mask corresponding to the exposure and development characteristics of the photoresist layer 5 is selected to form the above-described three different thicknesses of the photoresist pattern.

For example, when the formed photoresist layer 5 is formed of a positive photoresist material, that is, the positive photoresist material is insoluble in the developer before exposure, and after being exposed to ultraviolet light, it becomes to be soluble in the developer and thus being removed.

Figure 9:
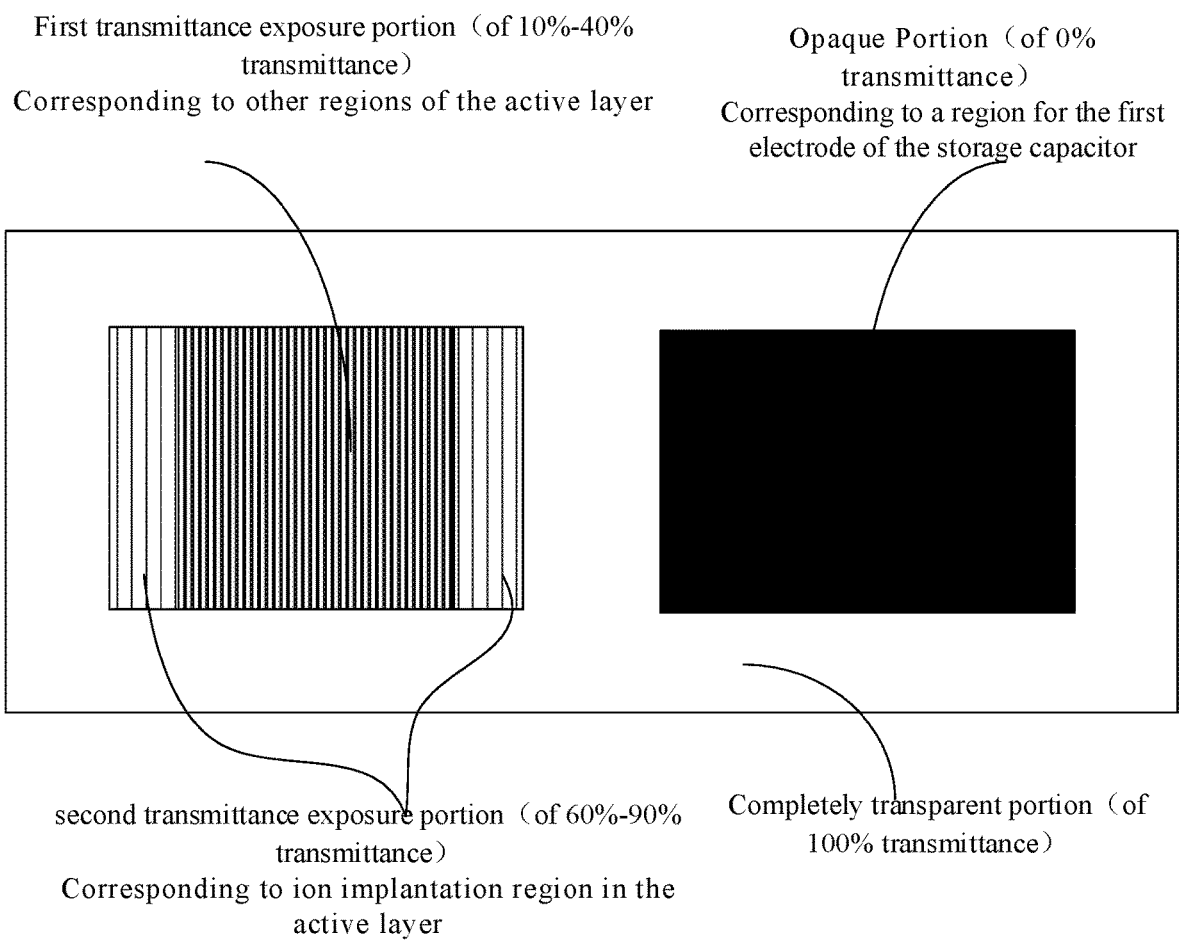
FIG. 9 illustrates an illustrative structure of a mask corresponding to the structure as illustrated in FIG. 8.

As illustrated in FIG. 9, the gray tone mask comprises a completely transparent portion, an opaque portion, a first transmittance exposure portion, and a second transmittance exposure portion; wherein the transmittance of the first transmittance exposure portion is smaller than the transmittance of the second transmittance exposure portion; the opaque portion corresponds to the first photoresist retained pattern to be formed (ie, corresponding to the region of the first electrode of the storage capacitor), the first transmittance exposure portion corresponds to the first region of the second photoresist retained pattern to be formed (ie, corresponding to other regions of the active layer), and the second transmittance exposure portion corresponds to the second region of the second photoresist retained pattern to be formed (ie, corresponding to the ion implantation region in the active layer) and the completely transparent portion correspond to remaining regions of the photoresist layer.

That is, the above three different thicknesses of the photoresist pattern are formed by a Gray-tone Mask or a Half-tone Mask having the above two partial transmittances.

As illustrated in FIG. 9, the transmittance of the first transmittance exposure portion can be 10% to 40%, that is, when the photoresist layer is composed of a positive photoresist material, after exposure and development, the first region of the second photoresist retained pattern (corresponding to remaining regions the active layer) has a thickness of 60% to 90% of the original thickness; and the transmittance of the second transmittance exposure portion can be 60% to 90%. That is, when the above photoresist layer is composed of a positive photoresist material, after exposure and development, the thickness of the second region of the second photoresist retained pattern (ie, corresponding to the ion implantation region in the active layer) is 10% to 40% of the original thickness.

The photoresist pattern is exposed and developed to form three different thicknesses in the above process in view of the following aspects. Firstly, the thickness of the photoresist corresponding to the ion implantation region in the active layer is kept to be minimum, so that ions injected at a high-speed pass through the second region of the second photoresist retained pattern and is doped into the active layer below the second region of the second photoresist retained pattern; secondly, the thickness of the photoresist of remaining region of the active layer other than the ion implantation region is greater than the thickness of the ion implantation region, such that surrounding area of the active layer exposed by the formed metal shielding pattern is kept from being converted into a conductive region through ion implantation when over-etching the metal film, thus doping ions contamination can be avoided and normal switching performance of the TFT is guaranteed; and thirdly, the thickness of the photoresist in other regions of the active layer is kept less than the thickness of photoresist in the first photoresist retained region corresponding to a first electrode region of the storage capacitor, such that this portion of the photoresist can be remained to the end, such that a portion of the metal film under the portion of the photoresist can be retained and forms a first electrode of the storage capacitor.

Of course, according to an embodiment of the present disclosure, a negative photoresist material having a reverse characteristic to that of a positive photoresist material can be selected, that is, the negative photoresist material can be dissolved in the developer before exposure, and after being exposed to ultraviolet light, it is converted into a property that it cannot be dissolved in the developer, so that the unexposed portion can be removed.

That is, when the formed photoresist layer 5 is composed of a negative photoresist material, the gray tone or halftone mask comprises a completely transparent portion, an opaque portion, a first transmittance exposure portion, and a first a second transmittance exposure portion; wherein, a transmittance of the first transmittance exposure portion is greater than a transmittance of the second transmittance exposure portion; the complete transparent portion corresponds to the first photoresist retained pattern of the to be formed, the opaque portion corresponds to the remaining region of the photoresist layer to be formed, the first transmittance exposure portion corresponds to the second region of the second photoresist retained pattern to be formed, and the second transmittance exposure portion corresponds to a first region of the second photoresist retained pattern to be formed.

The transmittance of the first transmittance exposure portion can be 60% to 90%, and the transmittance of the second transmittance exposure portion may be 10% to 40%, which can be referred to relative description on the mask for the positive photoresist, and will not elaborated herein.

Figure 10:
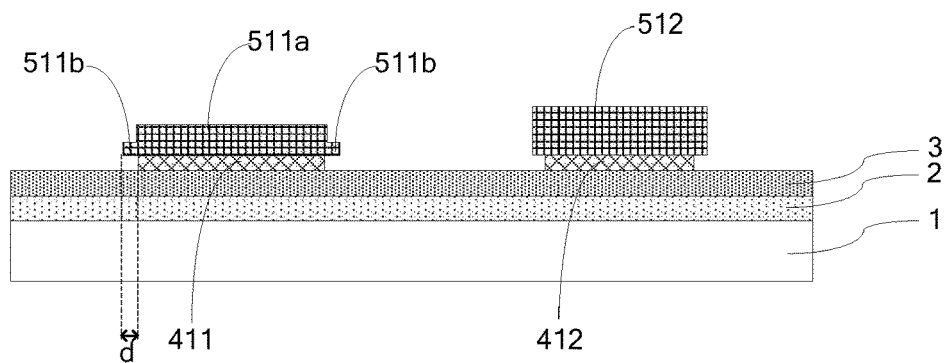
FIG. 10 is a schematic view illustrating a structure formed after a seventh step of a method for fabricating an array substrate according to an embodiment of the present disclosure.

As illustrated in FIG. 10, the region of the metal thin film exposed by the photoresist completely removed region is over-etched by wet etching so as to form a metal pattern layer, which is consisted of a first electrode 412 of the storage capacitor under the first photoresist retained pattern 512 and a metal shielding pattern 411 under the second photoresist retained pattern 511, wherein an outline of the metal shielding pattern 411 is located within an outline of the second photoresist retained pattern 511.

For the above process, it should be noted that, first, the term "outline" refers to edge lines for defining the range of the shape of a representation object. That the outline of the metal shielding pattern 411 is located within the outline of the second photoresist retained pattern 511, that is, the metal shielding pattern 411 is smaller than the second photoresist retained pattern 511, and there is a distance from the boundary of the metal shielding pattern 411 to the boundary of the second photoresist retained pattern 511.

Second, the above-mentioned "over-etching" is also called "etching more", which refers to a case of etching in which an etching limit exceeds the preset range during the etching process. Since the wet etching is isotropic, the etching rate for both vertical etching and lateral undercutting are the same in all directions. By utilizing this feature of the wet etching, an etching bias which is a distance d from peripheries of the meal shielding pattern 411 to the boundary of the second photoresist retained pattern 511 can be formed during over-etching on the region of the metal film exposed by the photoresist completely removed region.

The value of the distance d is determined by the amount of over-etching, and the amount of the over-etching can be an over-etching of 150%/0 to 200%. The amount of the over-etching can be determined according to the actual process for the array substrate, which is not limited in the present disclosure.

Wherein, the above-mentioned amount of over-etching can be an over-etching of 150%-200% means that when it takes t0 to form a same pattern of the metal film as the second photoresist retained pattern through wet-etching, the time for over-etching is (150%~200%)t0, that is, by extending the etching time, the lateral undercutting characteristics of the wet etching are used to etch the metal film under the second photoresist retained pattern continuously so as to for the etching bias of the distance d.

In this way, the metal shielding pattern 411 can expose the ion implantation region of the active layer to be formed subsequently, and simultaneously cover and protect a region of the active layer between the source and the drain (ie, the channel region when the TFT is turned on) so as to further avoid ionic contamination. In this case, the boundary of the metal shielding pattern 411 formed by the over-etching can be aligned with the boundary of the first region 511a of the second photoresist retained pattern 511, or the boundary of the metal shielding pattern 411 formed by the over-etching can partially overlap the second region 511b of the second photoresist retained pattern 511.

Third, one of ordinary skill in the art should understand that, since the above wet etching is performed in the same over-etching process, the outline of the pattern of the first electrode 412 of the storage capacitor is also of course located in the outline of the first photoresist retained pattern 512, that is, there is also an etching bias which is the distance d from the boundary of the pattern of the first electrode 412 of the storage capacitor to the boundary of the first photoresist retained pattern 512.

Figure 11:
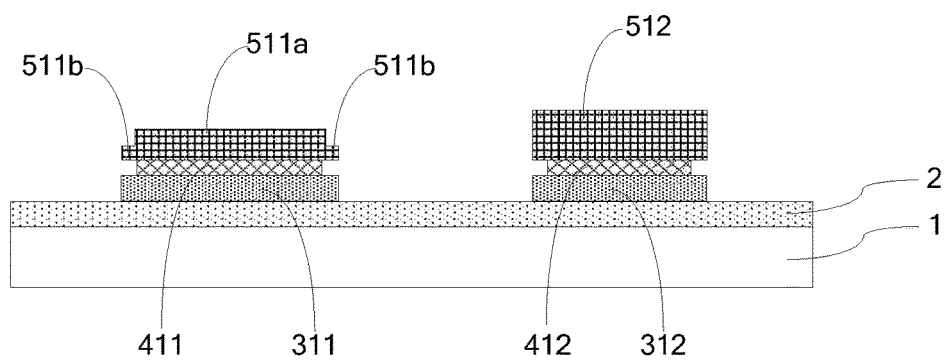
FIG. 11 is a schematic view illustrating a structure formed after a eighth step of a method for fabricating an array substrate according to an embodiment of the present disclosure.

As illustrated in FIG. 11, the polysilicon film 3 exposed by the first photoresist first retained pattern 512 and the second photoresist retained pattern 511 is etched by a process such as dry etching to form a polysilicon pattern layer. The polysilicon pattern layer is composed of a polysilicon retained pattern 312 under the first electrode 412 of the storage capacitor and an active layer 311 under the metal shielding pattern 411; wherein the pattern of the active layer 311 is the same as the second photoresist retained pattern 511;

here, the first photoresist retained pattern 512 and the photoresist second retention pattern 511 function as an etching stop layer.

Since the dry etching has good anisotropy, that is, there is only the vertical etching, and no lateral undercutting; thus, it can be guaranteed that the etched polysilicon film 3 can have a substantially identical geometry with the mask layer (ie, the second photoresist retained pattern 511). The dry etching can accurately control the shape of the sidewall profile with good etching uniformity, so a dry etch process is employed in the process.

Since the pattern of the active layer 311 is the same as that of the second photoresist retained pattern 511, the boundary of the formed polysilicon protrudes from the boundary of the meal film formed by over-etching by a distance d in all directions.

Figure 12:
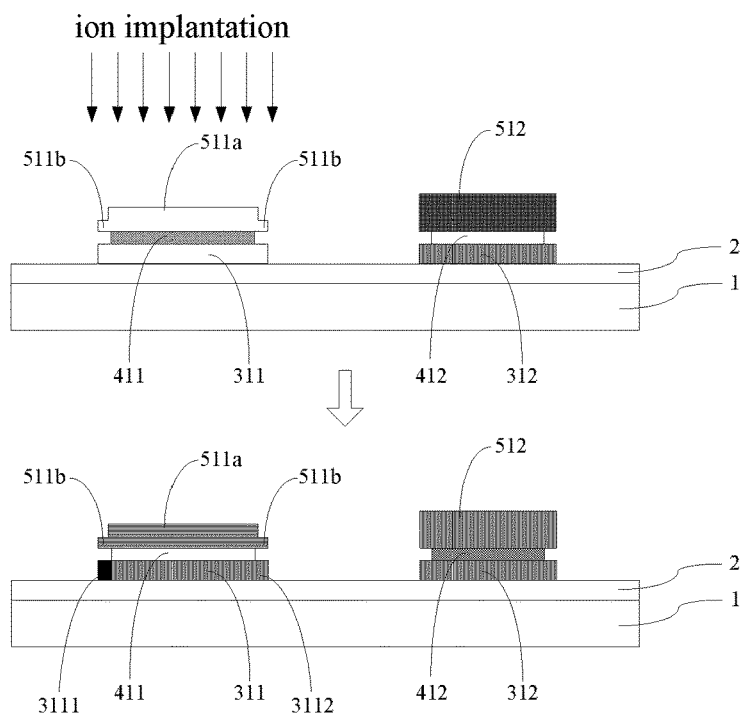
FIG. 12 is a schematic view illustrating a structure formed after a ninth step of a method for fabricating an array substrate according to an embodiment of the present disclosure.

As illustrated in FIG. 12, a region of the active layer 311 exposed by the metal shielding pattern 411 is ion-doped by an ion implant process to form a source contact region 3111 and a drain contact region 3112 which are formed by ion doping treatment and are disposed facing to each other;

here, the second photoresist retained pattern 511 and the metal shielding pattern 411 serve as a masking layer, such that the region of the active layer 311 not shielded by the metal shielding pattern 411 can be ion-doped. As the thickness of the photoresist in this region is the smallest, and its masking effect on the ion implantation is limited, some ions still penetrate the second region 511b of the second photoresist retained pattern and enter the margin regions of the active layer 311 which are disposed at both sides of the active layer 311 and are not covered by the metal shielding pattern 411, thereby completing the ion doping on the source contact region and the drain contact region.

The implanted ions can be P-type or N-type dopants, the P-type dopants can be, for example, boron ions, and the N-type dopants can be, for example, phosphorus ions.

Figure 13:
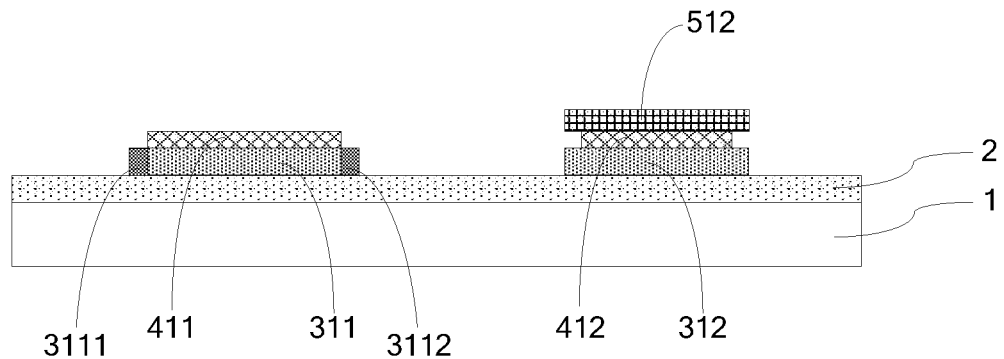
FIG. 13 is a schematic view illustrating a structure formed after a tenth step of a method for fabricating an array substrate according to an embodiment of the present disclosure.

As illustrated in FIG. 13, the second photoresist retained pattern 511 and the first photoresist retained pattern 512 are ashed by an ashing process to remove the second photoresist retained pattern 512 while leaving only the first photoresist retained pattern 511;

As the second photoresist retained pattern 512 is subject to the same ashing process, its thickness will be reduced. A portion of the second photoresist retained pattern 512 in a direction of the thickness will be remained on the first electrode 412 of the storage capacitor due to its greatest thickness.

Figure 14:
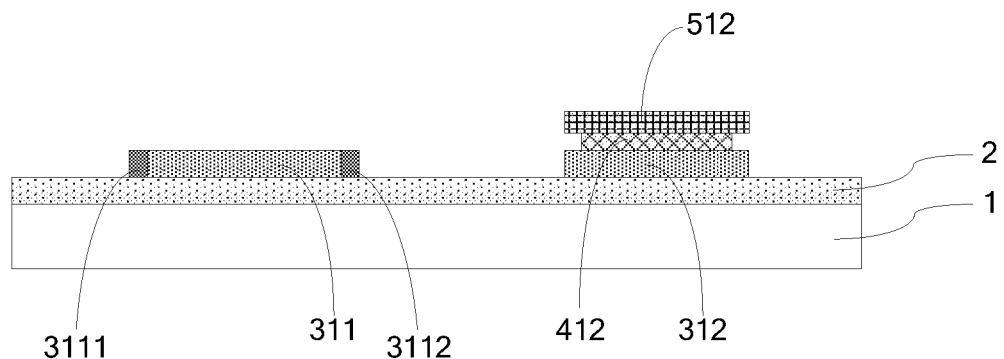
FIG. 14 is a schematic view illustrating a structure formed after a eleventh step of a method for fabricating an array substrate according to an embodiment of the present disclosure.

As illustrated in FIG. 14, the metal shielding pattern exposed by the second resist pattern of the removed photoresist which has been removed is etched through a wet etching process to remove the metal shielding pattern so as to expose the active layer 311;

That is, the first photoresist retained pattern 512 which has been thinned functions as an etching stop layer and protect the first electrode 412 of the storage capacitor from being removed in the same etching process.

In this way, the second photoresist retained pattern 511 is removed through an ashing process and the metal shielding pattern 411 is removed through a wet etching, thereby exposing the active layer 311.

Figure 15:
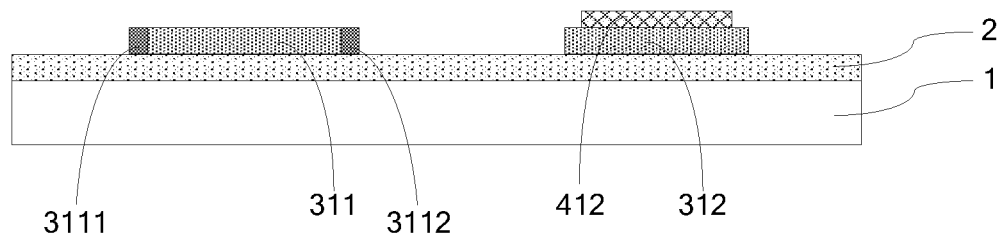
FIG. 15 is a schematic view illustrating a structure formed after a twelfth step of a method for fabricating an array substrate according to an embodiment of the present disclosure.

After that, as illustrated in FIG. 15, the first photoresist retained pattern is removed through a lift-off process to expose the first electrode 412 of the storage capacitor.

In this way, in the TFT array substrate, the active layer 311 formed of a polysilicon material, the source contact region 3111 and the drain contact region 3112 in the active layer 311 which are disposed oppositely, and the first electrode 412 of the storage capacitor formed by metal material can be completed by a mask.

Figure 16:
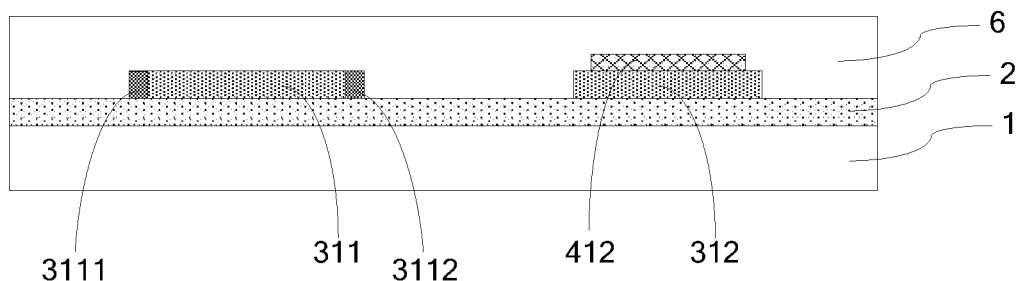
FIG. 16 is a schematic view illustrating a structure formed after a thirteenth step of a method for fabricating an array substrate according to an embodiment of the present disclosure.

As illustrated in FIG. 16, a gate insulating layer 6 is formed on the surface of the substrate formed as described above; the gate insulating layer 6 can be made of silicon nitride, silicon oxide, silicon oxynitride, or other insulating material.

Figure 17:
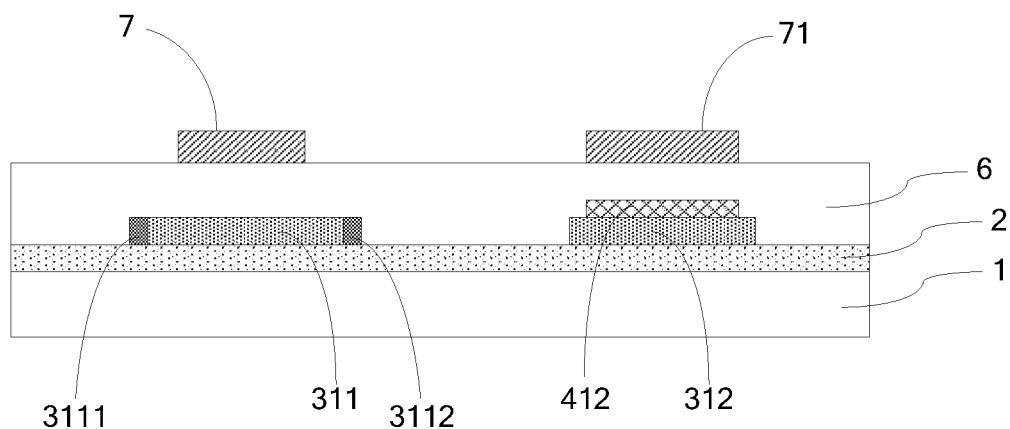
FIG. 17 is a schematic view illustrating a structure formed after a fourteenth step of a method for fabricating an array substrate according to an embodiment of the present disclosure.

As illustrated in FIG. 17, a gate electrode 7 for the thin film transistor, a gate line, and a second electrode 71 of the storage capacitor are formed on the surface of the gate insulating layer 6 through a patterning processing, such as film formation, photolithography, etching and the like.

Wherein the gate electrode 7, the gate line, and the second electrode 71 of the storage capacitor are formed through a single patterning process, metal materials for the gate electrode 7, the gate line, and the second electrode 71 can comprise, but not limited to, at least one of Ag, Al, Ti, Au, Cu, Mo, and Cr.

Figure 18:
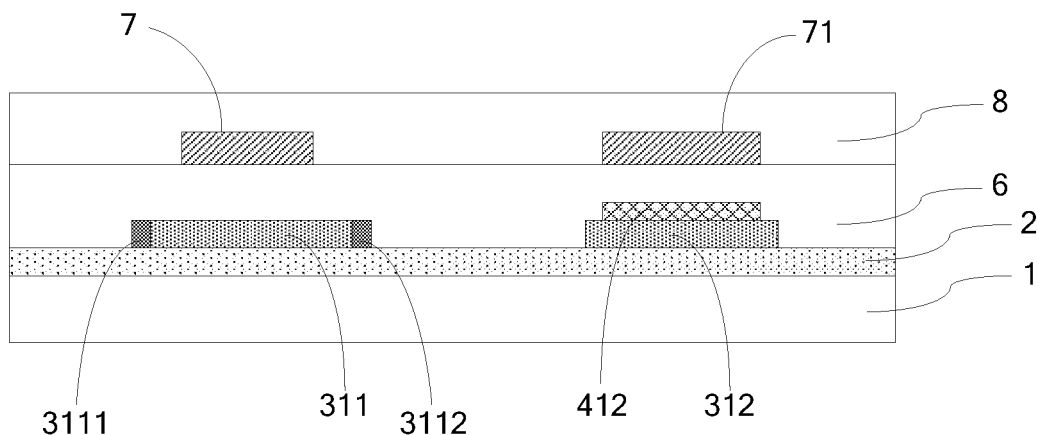
FIG. 18 is a schematic view illustrating a structure formed after a fifteenth step of a method for fabricating an array substrate according to an embodiment of the present disclosure.

As illustrated in FIG. 18, an interlayer insulating layer 8 is formed on the formed substrate; the interlayer insulating layer 8 can be made of silicon nitride, silicon oxide, silicon oxynitride, or other insulating material.

Figure 19:
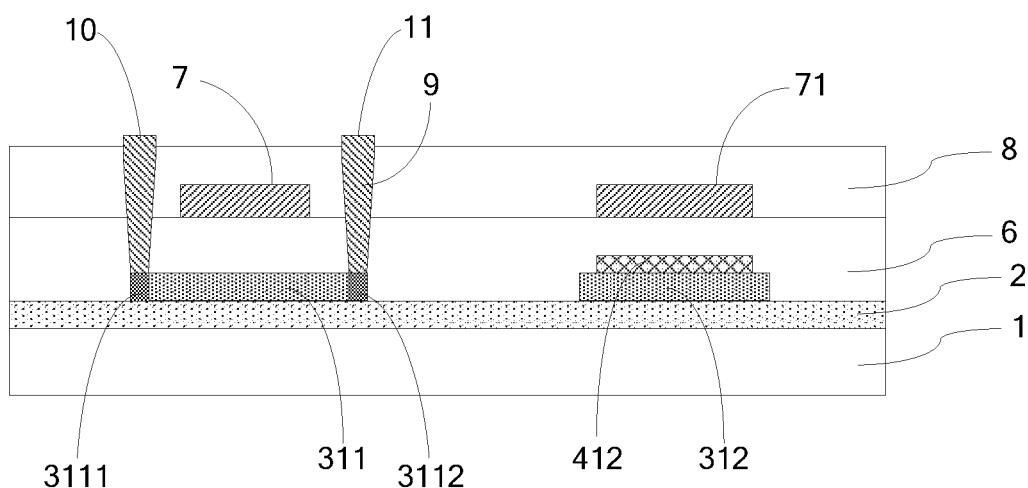
FIG. 19 is a schematic view illustrating a structure formed after a sixteenth step of a method for fabricating an array substrate according to an embodiment of the present disclosure.

As illustrated in FIG. 19, the first through hole and the second through hole 9 passing through the interlayer insulating layer 8 and the gate insulating layer 6 are formed by a patterning process such as coating photoresist on the interlayer insulating layer 8, exposing, developing, etching, or the like. The bottom of the two through holes 9 corresponds to the source contact region 3111 and the drain contact region 3112 in the active layer 311, that is, the two regions are exposed.

After that, as illustrated in FIG. 19, data lines are formed on the interlayer insulating layer 8 by process steps such as magnetron sputtering, photolithography, etching, etc., and a source electrode 10 and a drain electrode 11 connected to the source contact region 3111 and the drain contact region 3112 through the through holes 9, respectively.

Thus, an array substrate formed of LTPS (Low Temperature Poly Silicon) TFT is formed.

After that, the above embodiment can further comprise forming a pixel electrode connected to the drain and a common electrode disposed opposite to the pixel electrode, and the pixel electrode and the common electrode can be formed according to the related art, which will not be further described in the embodiment of the present disclosure.

Further, at least one embodiment of the present disclosure further provides an array substrate formed by the above preparation method, comprising an active layer made of a semiconductor material disposed on a substrate, and a semiconductor material retained pattern disposed in the same layer as the active layer, and a first electrode of storage capacitor made of metal material overlying the semiconductor material retained pattern.

Based on this, at least one embodiment of the present disclosure further provides a display device comprising the above array substrate. The display device can be a liquid crystal display, a liquid crystal television, an OLED (Organic Light-Emitting Display) display, a digital photo frame, a mobile phone, a tablet computer, a digital photo frame, a navigator, or the like having any display function.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201710326432.5 filed on May 10, 2017, the disclosure of which is hereby entirely incorporated by reference as a part of the present disclosure.

What is claimed is:

1. A method for manufacturing an array substrate, the array substrate comprising a thin film transistor and a storage capacitor, the method comprising:
    forming a semiconductor material film on a substrate;
    forming a metal film covering the semiconductor material film; and
    performing a single patterning process on the metal film and the semiconductor material film to form an active layer of the thin film transistor, a semiconductor material remained pattern and a first electrode of a storage capacitor, wherein the semiconductor material remained pattern is in a same layer as the active layer, and the first electrode of the storage capacitor is formed of the metal film and is on a side, which is away from the substrate, of the semiconductor material remained pattern;
    performing a doping process on the active layer to form a source contact region and a drain contact region of the thin film transistor;
    after the doping process, forming a gate insulating layer of the thin film transistor on the active layer of the thin film transistor; and
    forming a gate metal pattern layer on the gate insulating layer, the gate metal pattern layer comprising a gate electrode of the thin film transistor and a second electrode of the storage capacitor.

2. The method according to claim 1, wherein a metal shielding pattern is further formed by performing the single patterning process on the metal film and the semiconductor material film,
    wherein the metal shielding pattern is in a same layer and made of a same material as the first electrode of the storage capacitor, and is insulated from the first electrode of the storage capacitor.

3. A method for manufacturing an array substrate, comprising:
    forming a semiconductor material film on a substrate;
    forming a metal film covering the semiconductor material film; and
    performing a single patterning process on the metal film and the semiconductor material film to form an active layer, a semiconductor material remained pattern and a first electrode of a storage capacitor;
    wherein the semiconductor material remained pattern is in a same layer as the active layer; the first electrode of the storage capacitor is formed of the metal film and is on a side, which is away from the substrate, of the semiconductor material remained pattern;
    the semiconductor material film is a polysilicon film, and performing the single patterning process on the metal film and the semiconductor material film to form the active layer and the first electrode of the storage capacitor comprises:
    forming a photoresist layer covering the metal film;
    exposing and developing the photoresist layer through a gray tone mask so as to form a first photoresist retained region, a second photoresist retained region, and a photoresist completely removed region, wherein the first photoresist retained region corresponds to a region for the first electrode of the storage capacitor to be formed and is slightly larger than the region for the first electrode of the storage capacitor to be formed; the second photoresist retained region comprise a first region and second regions which are located at both sides of the first region and are contiguous to the first region, the second region corresponding to a source contact region and a drain contact region in the active layer which are disposed opposite to each other, the first region corresponding to remaining regions of the active layer to be formed, and thicknesses of the first photoresist retained pattern, the first region and the second region are reduced in order; the photoresist completely removed region corresponding to regions of the photoresist layer other than the first photoresist retained region and the second photoresist retained region;
    a region of the metal thin film exposed by the photoresist completely removed region is over-etched by wet etching so as to form the first electrode of the storage capacitor under the first photoresist retained pattern and a metal shielding pattern under the second photoresist retained pattern, wherein an outline of the metal shielding pattern is located within an outline of the second photoresist retained pattern;
    etching a portion of the polysilicon film exposed by the first photoresist retained pattern and the second photoresist retained pattern, so as to form a polysilicon retained pattern under the first electrode of the storage and the active layer under the metal shielding pattern, wherein a pattern of the active layer is substantially same as the second photoresist retained pattern;

ion-doping a region of the active layer exposed by the metal shielding pattern through an ion implantation process, so as to form the source contact region and the drain contact region which are formed by ion implantation treatment and are disposed opposite to each other;

removing the second photoresist retained pattern and the metal shielding pattern in sequence, so as to expose the active layer; and removing the first photoresist retained pattern so as to expose the first electrode of the storage capacitor.

4. The method according to claim 3, wherein removing the second photoresist retained pattern and the metal shielding pattern in sequence, so as to expose the active layer comprises:

ashing the first photoresist retained pattern and the second photoresist retained pattern through an ashing process so as to remove the second photoresist retained pattern and to retain a portion of the first photoresist retained pattern in a direction of thickness; and etching a portion of the metal shielding pattern exposed by the second photoresist retained pattern which has been removed so as to remove the exposed portion of the metal shielding pattern and expose the active layer.

5. The method according to claim 3, wherein when etching time for forming a pattern of the metal film same as the second photoresist retained pattern through wet-etching is t0, a time for the over-etching is (150%~200%)t0.

6. The method according to claim 3, wherein implanted ions are P-type or N-type dopants.

7. The method according to claim 1, wherein the semiconductor material film is a polysilicon film;

forming the semiconductor material film on the substrate comprising:

forming a buffer layer and an amorphous silicon film on the substrate in sequence; and annealing the amorphous silicon film, so as to crystallize the amorphous silicon film into a polysilicon film.

8. The method according to claim 2, further comprising, in sequence:

forming an interlay insulating layer covering the gate metal pattern layer;

forming a first through hole and a second through hole passing through the interlayer insulating layer and the gate insulating layer; and forming source/drain metal pattern layer disposed on the interlayer insulating layer, the source/drain metal pattern layer comprising a source electrode connected to the source contact region through the first through hole, a drain electrode connected to the drain contact region through the second through hole, and a data line connected to the source electrode.

9. An array substrate, comprising a thin film transistor, a storage capacitor and a semiconductor material retained pattern on a substrate, wherein an active layer of the thin film transistor and the semiconductor material retained pattern are formed of a same semiconductor material and in a same layer, and a first electrode of the storage capacitor is made of a metal material and is covered on the semiconductor material retained pattern;

a gate insulating layer of the thin film transistor is covered on the active layer of the thin film transistor and the first electrode of the storage capacitor, a gate electrode of the thin film transistor is on the gate insulating layer, and a second electrode of the storage capacitor is made of a same material and in a same layer as the gate electrode of the thin film transistor;

the active layer of the thin film transistor comprises a source doping region, a drain doping region and a channel region between the source contact region and the drain contact region; an outline of the gate electrode of the thin film transistor is not overlapped with an outline of the channel region in a direction perpendicular to the substrate.

10. The array substrate according to claim 9, wherein a projection of the first electrode of the storage capacitor on the substrate is located within a projection of the semiconductor material retained pattern on the substrate.

11. The array substrate according to claim 9, wherein a width of the semiconductor material retained pattern protruding from the first electrode of the storage capacitor is substantially same as a width of the source/drain doping regions.

12. The array substrate according to claim 9, wherein material for the gate electrode and the second electrode of the storage capacitor comprises at least one of Ag, Al, Ti, Au, Cu, Mo, and Cr.

13. A display device, comprising the array substrate according to claim 9.

14. The method according to claim 2, wherein the semiconductor material film is a polysilicon film;

forming the semiconductor material film on the substrate comprising:

forming a buffer layer and an amorphous silicon film on the substrate in sequence; and annealing the amorphous silicon film, so as to crystallize the amorphous silicon film into a polysilicon film.

15. The method according to claim 3, further comprising, in sequence:

forming a gate insulating layer covering the active layer and the first electrode of the storage capacitor;

forming a gate metal pattern layer disposed on the gate insulating layer, the gate metal pattern layer comprising a gate electrode corresponding to the active layer, a gate line connected to the gate electrode, and a second electrode of the storage capacitor corresponding to the first electrode of the storage capacitor;

forming an interlay insulating layer covering the gate metal pattern layer;

forming a first through hole and a second through hole passing through the interlayer insulating layer and the gate insulating layer; and forming source/drain metal pattern layer disposed on the interlayer insulating layer, the source/drain metal pattern layer comprising a source electrode connected to the source contact region through the first through hole, a drain electrode connected to the drain contact region through the second through hole, and a data line connected to the source electrode.

16. The method according to claim 4, further comprising, in sequence:

forming a gate insulating layer covering the active layer and the first electrode of the storage capacitor;

forming a gate metal pattern layer disposed on the gate insulating layer, the gate metal pattern layer comprising a gate electrode corresponding to the active layer, a gate line connected to the gate electrode, and a second electrode of the storage capacitor corresponding to the first electrode of the storage capacitor;

forming an interlay insulating layer covering the gate metal pattern layer;

forming a first through hole and a second through hole passing through the interlayer insulating layer and the gate insulating layer; and forming source/drain metal pattern layer disposed on the interlayer insulating layer, the source/drain metal pattern layer comprising a source electrode connected to the source contact region through the first through hole, a drain electrode connected to the drain contact region through the second through hole, and a data line connected to the source electrode.

17. The method according to claim 5, further comprising, in sequence:

forming a gate insulating layer covering the active layer and the first electrode of the storage capacitor;

forming a gate metal pattern layer disposed on the gate insulating layer, the gate metal pattern layer comprising a gate electrode corresponding to the active layer, a gate line connected to the gate electrode, and a second electrode of the storage capacitor corresponding to the first electrode of the storage capacitor;

forming an interlay insulating layer covering the gate metal pattern layer;

forming a first through hole and a second through hole passing through the interlayer insulating layer and the gate insulating layer; and forming source/drain metal pattern layer disposed on the interlayer insulating layer, the source/drain metal pattern layer comprising a source electrode connected to the source contact region through the first through hole, a drain electrode connected to the drain contact region through the second through hole, and a data line connected to the source electrode.

18. The method according to claim 2, wherein the signal patterning process is performed by forming a grey tone mask photoresist layer on the metal film;

performing the doping process on the active layer to form the source contact region and the drain contact region, comprises:

using the metal shielding pattern and the photoresist layer together as a doping mask to perform the doping process on the active layer to form the source contact region and the drain contact region.

19. The method according to claim 18, further comprising:

removing the metal shielding pattern after the doping process and before forming the gate insulating layer.

20. The array substrate according to claim 9, wherein at least a portion of an orthographic projection of the outline of the gate electrode of the thin film transistor on the substrate is within an orthographic projection of the outline of the channel region on the substrate.

* * * * *